United States Patent
Cypher

(10) Patent No.: US 8,601,339 B1
(45) Date of Patent: Dec. 3, 2013

(54) LAYERED CODING TECHNIQUES FOR DATA STORAGE

(75) Inventor: Robert Cypher, Saratoga, CA (US)

(73) Assignee: Google Inc., Mountain View, CA (US)

(*) Notice: Subject to any disclaimer, the term of this patent is extended or adjusted under 35 U.S.C. 154(b) by 98 days.

(21) Appl. No.: 13/162,077

(22) Filed: Jun. 16, 2011

Related U.S. Application Data

(60) Provisional application No. 61/355,261, filed on Jun. 16, 2010.

(51) Int. Cl.
*H03M 13/00* (2006.01)

(52) U.S. Cl.
USPC .................... 714/752; 714/786; 714/781

(58) Field of Classification Search
USPC ........................... 714/752, 786, 781
See application file for complete search history.

(56) References Cited

U.S. PATENT DOCUMENTS

| | | | |
|---|---|---|---|
| 6,032,269 A | 2/2000 | Renner | |
| 6,151,641 A | 11/2000 | Herbert | |
| 6,216,247 B1 | 4/2001 | Creta et al. | |
| 6,378,038 B1 | 4/2002 | Richardson et al. | |
| 6,721,317 B2 | 4/2004 | Chong | |
| 7,356,752 B2 | 4/2008 | Hewitt et al. | |
| 7,398,459 B2 | 7/2008 | Park et al. | |
| 7,505,890 B2 | 3/2009 | Kuznetsov et al. | |
| 7,546,484 B2 | 6/2009 | Sen et al. | |
| 7,624,229 B1 | 11/2009 | Longinov | |
| 7,676,730 B2 | 3/2010 | Haugan et al. | |
| 7,739,446 B2 | 6/2010 | Kano | |
| 7,774,681 B2 | 8/2010 | Earhart et al. | |
| 7,831,764 B2 | 11/2010 | Nakajima et al. | |
| 7,861,035 B2 | 12/2010 | Baek et al. | |
| 7,861,052 B2 | 12/2010 | Kawamura et al. | |
| 8,065,555 B2 | 11/2011 | Maiyuran et al. | |
| 8,082,393 B2 | 12/2011 | Galloway et al. | |
| 8,086,783 B2 * | 12/2011 | O'Connor et al. | 711/5 |
| 8,090,792 B2 | 1/2012 | Dubnicki et al. | |
| 8,140,753 B2 | 3/2012 | Galloway et al. | |
| 8,145,865 B1 | 3/2012 | Longinov et al. | |
| 8,176,247 B2 | 5/2012 | Galloway et al. | |
| 8,180,954 B2 | 5/2012 | Kilzer et al. | |
| 8,213,205 B2 | 7/2012 | Rajan | |
| 8,234,539 B2 | 7/2012 | Erez | |

(Continued)

OTHER PUBLICATIONS

Hafner, James; "HoVer Erasure Codes for Disk Arrays;" Proceedings of the 2006 International Conference on Dependable Systems and Networks; pp. 217-226; 2006; 10 pages.

(Continued)

*Primary Examiner* — Albert Decady
*Assistant Examiner* — Osman Alshack
(74) *Attorney, Agent, or Firm* — Fish & Richardson P.C.

(57) ABSTRACT

Methods, systems, and apparatus, including computer programs encoded on a computer storage medium, for skewed orthogonal coding techniques. In one aspect, a method includes receiving a block of data comprising a plurality of data chunks. One or more rows of word code chunks are generated using a first error-correcting code in systematic form and the plurality of data chunks. For each row of a plurality of rows of the data chunks, one or more row code chunks for the row are generated using a second error-correcting code in systematic form and the data chunks of the row. The rows of data chunks and the row code chunks and the rows of word code chunks are stored.

39 Claims, 12 Drawing Sheets

(56) References Cited

U.S. PATENT DOCUMENTS

| | | | |
|---|---|---|---|
| 8,255,761 B1* | 8/2012 | Pi et al. | 714/752 |
| 8,279,755 B2* | 10/2012 | Luby | 370/230 |
| 8,327,234 B2* | 12/2012 | Earnshaw et al. | 714/780 |
| 8,327,237 B2* | 12/2012 | Buckley et al. | 714/781 |
| 2003/0149750 A1 | 8/2003 | Franzenburg | |
| 2006/0080505 A1 | 4/2006 | Arai et al. | |
| 2009/0262839 A1* | 10/2009 | Shelby et al. | 375/240.27 |
| 2009/0265578 A1 | 10/2009 | Baloun et al. | |
| 2010/0037117 A1 | 2/2010 | Pescatore | |
| 2010/0217915 A1* | 8/2010 | O'Connor et al. | 711/5 |
| 2012/0036333 A1* | 2/2012 | Lecrone et al. | 711/162 |
| 2012/0042142 A1* | 2/2012 | Garman et al. | 711/162 |
| 2012/0042200 A1 | 2/2012 | Takeuchi et al. | |
| 2012/0042201 A1 | 2/2012 | Resnick | |
| 2012/0131383 A1 | 5/2012 | Galloway et al. | |
| 2012/0246548 A1* | 9/2012 | Buckley et al. | 714/807 |

OTHER PUBLICATIONS

Li, Mingqiang; "GRID Codes: Strip-Based Erasure Codes with High Fault Tolerance for Storage Systems;" ACM Transactions on Storage, vol. 4, No. 4, Article 15, Jan. 2009; 22 pages.

Duminuco, Alessandro; "Hierarchical Codes: How to Make Erasure Codes Attractive for Peer-to-Peer Storage Systems;" Proceedings of the Eighth International Conference on Peer-to-Peer Computing; 2008 (P2P'08), pp. 8-11; 10 pages.

Wikipedia; Reed Solomon; http://en.wikipedia.org/wiki/Reed_Solomon; last modified Sep. 13, 2006, 14 pages.

* cited by examiner

Data

| D0 | D1 | D2 | D3 | D4 | D5 | C0,0 | C1,0 |
|----|----|----|----|----|----|------|------|
| D6 | D7 | D8 | D9 | D10 | D11 | C0,1 | C1,1 |
| D12 | D13 | D14 | D15 | D16 | D17 | C0,2 | C1,2 |
| D18 | D19 | D20 | D21 | D22 | D23 | C0,3 | C1,3 |
| D24 | D25 | D26 | D27 | D28 | D29 | C0,4 | C1,4 |
| D30 | D31 | D32 | D33 | D34 | D35 | C0,5 | C1,5 |
| D36 | D37 | D38 | D39 | D40 | D41 | C0,6 | C1,6 |
| C0 | C1 | C2 | C3 | C4 | C5 | C0,7 | C1,7 |

Row Code Chunks

Word Code Chunks

FIG. 2C

Data

| D0 | D1 | D2 | D3 | D4 | D5 | C0,0 | C1,0 |
|----|----|----|----|----|----|------|------|
| D6 | D7 | D8 | D9 | D10 | D11 | C0,1 | C1,1 |
| D12 | D13 | D14 | D15 | D16 | D17 | C0,2 | C1,2 |
| D18 | D19 | D20 | D21 | D22 | D23 | C0,3 | C1,3 |
| D24 | D25 | D26 | D27 | D28 | D29 | C0,4 | C1,4 |
| D30 | D31 | D32 | D33 | D34 | D35 | C0,5 | C1,5 |
| D36 | D37 | D38 | D39 | D40 | D41 | C0,6 | C1,6 |
| C2 | C3 | C4 | C5 | C6 | C7 | C0,7 | C1,7 |

Row Code Chunks

Word Code Chunks

FIG. 4C

| 1 | 0 | 0 | 0 | 0 | 0 | 0 | 0 | 0 | 1 | g0,10 g0,11 g0,12 |
| 0 | 1 | 0 | 0 | 0 | 0 | 0 | 0 | 0 | 1 | g1,10 g1,11 g1,12 |
| 0 | 0 | 1 | 0 | 0 | 0 | 0 | 0 | 0 | 1 | g2,10 g2,11 g2,12 |
| 0 | 0 | 0 | 1 | 0 | 0 | 0 | 0 | 0 | 1 | g3,10 g3,11 g3,12 |
| 0 | 0 | 0 | 0 | 1 | 0 | 0 | 0 | 0 | 1 | g4,10 g4,11 g4,12 |
| 0 | 0 | 0 | 0 | 0 | 1 | 0 | 0 | 0 | 1 | g5,10 g5,11 g5,12 |
| 0 | 0 | 0 | 0 | 0 | 0 | 1 | 0 | 0 | 1 | g6,10 g6,11 g6,12 |
| 0 | 0 | 0 | 0 | 0 | 0 | 0 | 1 | 0 | 1 | g7,10 g7,11 g7,12 |
| 0 | 0 | 0 | 0 | 0 | 0 | 0 | 0 | 1 | 1 | g8,10 g8,11 g8,12 |

| | | | | | | | | | | | | | | |
|---|---|---|---|---|---|---|---|---|---|---|---|---|---|---|
| 1 | 0 | 0 | 0 | 0 | 0 | 0 | 0 | 0 | 1 | 0 | 0 | g0,10 | g0,11 | g0,12 |
| 0 | 1 | 0 | 0 | 0 | 0 | 0 | 0 | 0 | 1 | 0 | 0 | g1,10 | g1,11 | g1,12 |
| 0 | 0 | 1 | 0 | 0 | 0 | 0 | 0 | 0 | 1 | 0 | 0 | g2,10 | g2,11 | g2,12 |
| 0 | 0 | 0 | 1 | 0 | 0 | 0 | 0 | 0 | 0 | 1 | 0 | g3,10 | g3,11 | g3,12 |
| 0 | 0 | 0 | 0 | 1 | 0 | 0 | 0 | 0 | 0 | 1 | 0 | g4,10 | g4,11 | g4,12 |
| 0 | 0 | 0 | 0 | 0 | 1 | 0 | 0 | 0 | 0 | 1 | 0 | g5,10 | g5,11 | g5,12 |
| 0 | 0 | 0 | 0 | 0 | 0 | 1 | 0 | 0 | 0 | 0 | 1 | g6,10 | g6,11 | g6,12 |
| 0 | 0 | 0 | 0 | 0 | 0 | 0 | 1 | 0 | 0 | 0 | 1 | g7,10 | g7,11 | g7,12 |
| 0 | 0 | 0 | 0 | 0 | 0 | 0 | 0 | 1 | 0 | 0 | 1 | g8,10 | g8,11 | g8,12 |

FIG. 5C

LAYERED CODING TECHNIQUES FOR DATA STORAGE

CROSS-REFERENCE TO RELATED APPLICATIONS

This application claims the benefit under 35 U.S.C. §119 (e) of U.S. Patent Application No. 61/355,261, entitled "Techniques for Data Storage, Access, and Maintenance," filed Jun. 16, 2010, which is incorporated herein by reference in its entirety.

BACKGROUND

This specification relates to digital data processing and, in particular, data storage, access, and maintenance.

Important data is conventionally stored on storage devices that potentially fail. The data can be backed-up and stored redundantly so that the data can be recovered if a storage device fails. Conventional data centers can store large amounts of data. Some data is stored redundantly across multiple data centers so that even if an entire data center fails the data can be recovered.

Data can be stored using error-detecting codes. An error-detecting code adds extra data to the data that enables detection of certain errors in the data. One example of an error-detecting code is a cyclic redundancy check (CRC). CRC codes are used to detect failures on storage devices (e.g., hard disk drives).

Data can also be stored using error-correcting codes. An error-correcting code adds extra data to the data that enables correction of errors in the data. The number of errors that can be corrected is limited by the amount of extra data that is added. Examples of error-correcting codes include Reed-Solomon codes.

SUMMARY

An encoding system stores data chunks at groups of storage nodes, e.g., data centers, with error-correcting code chunks used to reconstruct damaged data. Layered codes are created from two or more error-correcting codes. One of the codes is used to create word code chunks based on a whole block of data and one of the codes is used to create row code chunks for rows of data within the block of data. Nested codes are created from one or more error-correcting codes used to create word code chunks and row code chunks; however, nested codes create split row code chunks by splitting row code chunks into separate components per row.

In general, one innovative aspect of the subject matter described in this specification can be embodied in methods that include the actions of receiving a block of data comprising a plurality of data chunks; generating one or more rows of word code chunks using a first error-correcting code in systematic form and the plurality of data chunks; for each row of a plurality of rows of the data chunks, generating one or more row code chunks for the row using a second error-correcting code in systematic form and the data chunks of the row; and storing the rows of data chunks and the row code chunks and the rows of word code chunks. Other embodiments of this aspect include corresponding systems, apparatus, and computer programs, configured to perform the actions of the methods, encoded on computer storage devices. A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

These and other embodiments can each optionally include one or more of the following features. Storing the rows of data chunks and the row code chunks comprises allocating each row to a distinct group of storage nodes. A correlation of storage node failures within each group of storage nodes is higher than a correlation of failures between groups of storage nodes. Communication between storage nodes at a group uses fewer resources or has a lower latency than communication between groups of storage nodes. Each group of storage nodes is a data center. The actions further include: identifying a damaged data chunk at a first group of storage nodes; determining that the damaged chunk cannot be reconstructed without communicating with other groups of storage nodes; receiving healthy chunks from other groups of storage nodes so that at least m*n healthy chunks are available, wherein the healthy chunks are data chunks, word code chunks, or both, and wherein the block of data includes m*n chunks; and reconstructing the damaged data chunk using the healthy chunks. The actions further include: reconstructing as many other damaged data chunks at the first group of storage nodes as is possible using the row code chunks and any healthy data chunks allocated to the first group of storage nodes. Receiving healthy chunks comprises instructing the other groups to reconstruct as many other damaged chunks of data at those groups as is possible using each group's row code chunks and any healthy data chunks allocated to those groups. Determining that the damaged chunk cannot be reconstructed without communicating with other groups of storage nodes comprises determining that a number of damaged chunks of the m*n chunks at the first group of storage nodes is greater than the number of row code chunks allocated to the first group of storage nodes for the m*n chunks. The first linear error-correcting code is distinct from the second linear error-correcting code. The first linear error-correcting code and the second linear error-correcting code are maximum distance separable (MDS) codes. Each data chunk and each code chunk is stored using an error-detecting code so that damaged chunks can be identified. Storing the rows of data chunks and the row code chunks comprises storing each chunk at a distinct storage node.

Particular embodiments of the subject matter described in this specification can be implemented so as to realize one or more of the following advantages. Data can be stored, accessed, and maintained at one or more storage nodes. The amount of storage capacity required can be reduced, the amount of data that must be read to reconstruct a damaged chunk can be reduced, and the expected time to data loss can be increased for both random failures and for burst failures. The number of disks accessed in order to reconstruct a damaged chunk can be reduced, and the amount of data communicated between data centers in order to reconstruct a damaged chunk can be reduced.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 2A-C are schematic diagrams that illustrate an example layered coding technique by showing data chunks and code chunks that form codewords.

FIGS. 4A-C are schematic diagrams that illustrate an example nested coding technique by showing data chunks and code chunks that form codewords.

FIGS. 5A-C illustrate an example nested code by showing an example generator matrix for the code.

Like reference numbers and designations in the various drawings indicate like elements.

DETAILED DESCRIPTION

Figure 1:
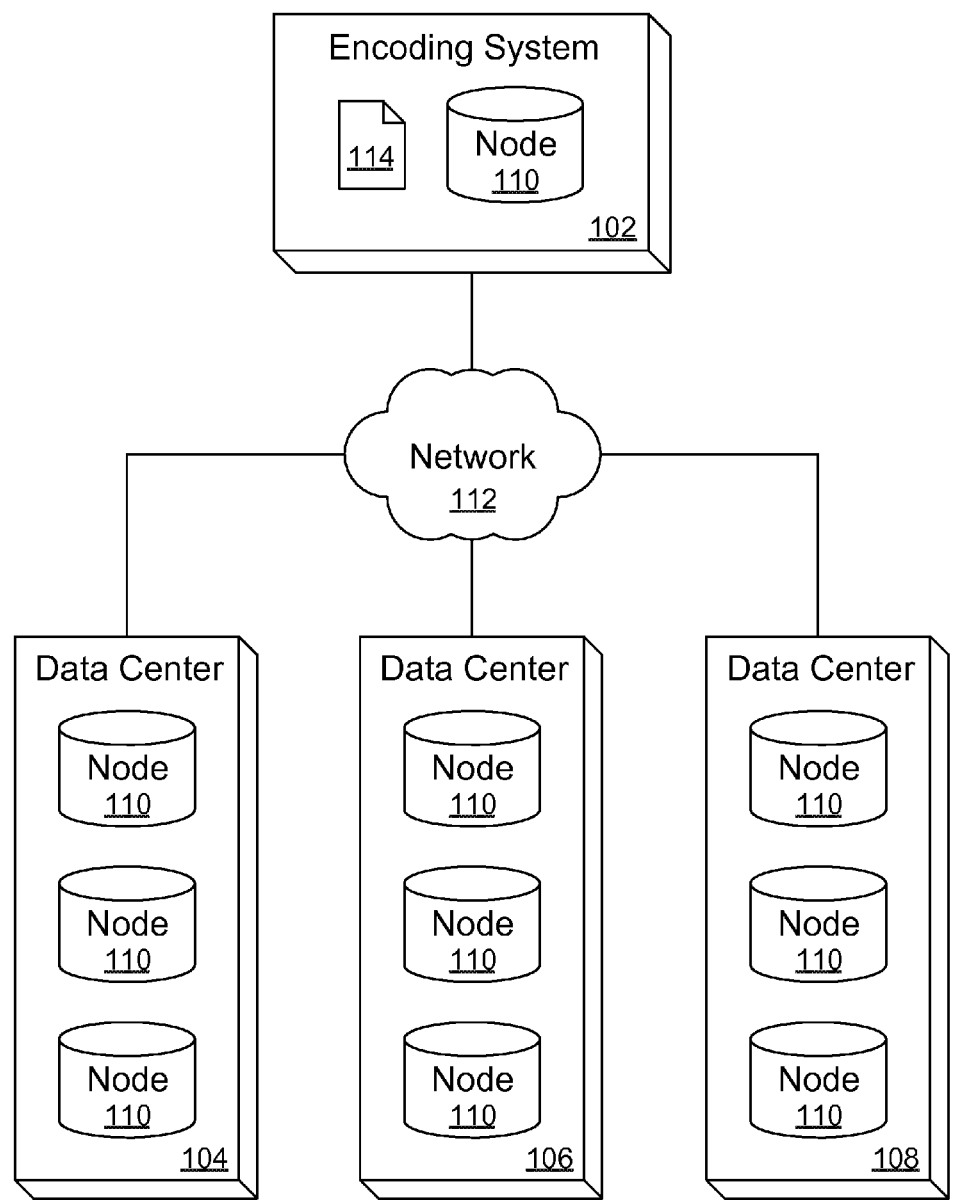
FIG. 1 is a schematic diagram of an example encoding system configured to store data across groups of storage nodes.

FIG. 1 is a schematic diagram of an example encoding system 102 configured to store data across groups of storage nodes.

The encoding system 102 comprises one or more data processing apparatus. The encoding system 102 can store data chunks from a file 114 data at, for example, one or more local storage nodes 114, across storage nodes 110 at data centers 104, 106, and 108, or both. The encoding system 102 can also store redundant copies of data chunks and error-correcting code chunks. The encoding system communicates with the data centers 104, 106, and 108 using a network 112.

A storage node includes one or more computer storage mediums. In some implementations, a storage node is a data server, for example, a server including a data processing apparatus and multiple hard disk drives on which data can be stored. A group of storage nodes can include a rack, a sub-network, a data center, or various other collections of servers or storage nodes.

A data center is a group of storage nodes. Typically, a data center is a facility with physical space for computer systems. Data centers can include, for example, telecommunication systems, backup power supplies, climate controls, and security. In FIG. 1, the data centers 104, 106, and 108 are shown with three storage nodes; however, each data center can have more or fewer storage nodes.

A data chunk is a specified amount of data. In some implementations, a data chunk is a contiguous portion of data from a file. In other implementations, a data chunk is one or more non-continuous portions of data from a file. For example, a data chunk can be 256 bytes or other units of data.

A damaged chunk is a chunk containing one or more errors. Typically, a damaged chunk is identified using an error detecting code. For example, a damaged chunk can be completely erased (e.g., if the chunk was stored in a hard drive destroyed in a hurricane), or a damaged chunk can have a single bit flipped. A healthy chunk is a chunk that is not damaged. A damaged chunk can be damaged intentionally, for example, where a particular storage node is shut down for maintenance. In that case, damaged chunks can be identified by identifying chunks that are stored at storage nodes that are being shut down.

An error-correcting code chunk includes a chunk of data based on one or more data chunks. In some implementations, each code chunk is the same specified size (e.g., 256 bytes) as the data chunks. The code chunks are generated using an error-correcting code, e.g., a Maximal Distance Separable (MDS) code. Examples of MDS codes include Reed-Solomon codes. Various techniques can be used to generate the code chunks. In general, any error-correcting code can be used that can reconstruct d data chunks from any set of d unique, healthy chunks (either data chunks or code chunks).

A codeword is a set of data chunks and code chunks based on those data chunks. If an MDS code is used to generate a codeword containing d data chunks and n code chunks, then all of the chunks (data or code) can be reconstructed as long as any d healthy chunks (data or code) are available from the codeword.

In layered and nested coding techniques, a block of data chunks and error-correcting code chunks that is being stored is viewed as forming a two dimensional R×C array. There are X code chunks for each row (called "row code chunks") that can be used to reconstruct X or fewer damaged chunks per row. There are Y code chunks (called "word code chunks") for the entire 2-D array. When there are more than X damaged chunks in one or more rows, the word code chunks are used to reconstruct damaged chunks. Although some examples described in this specification illustrate blocks of data chunks and code chunks as forming a two dimensional array, it is possible for coding techniques to create blocks configured differently. For instance, different rows can have different numbers of row code chunks, and rows that contain word code chunks can have different numbers of columns than rows that contain data chunks and row code chunks.

The codes can be used to store data across data centers 104, 106, and 108 (or other groups of storage nodes) by allocating each row of data chunks to a data center. Each chunk within the row can be allocated to a storage node (e.g., a computer or a rack of computers) within a data center. Then, if X or fewer chunks are lost at a data center, the chunks can be reconstructed using only intra-data center communication (e.g., so no other data centers have to provide data in performing reconstruction.) If more than X chunks are lost in one or more data centers, then the Y word code chunks are used to attempt reconstruction. Thus, inter-data center communication (which may be more expensive, e.g., slower than intra-data center communication) is only required when more than X chunks are damaged within a single data center.

The codes can also be used within a single data center. Instead of allocating different rows to different data centers, the encoding system 102 stores all of the rows at a single data center. The data and code chunks can be stored at distinct storage nodes within that data center. This is useful, for example, where reading data from storage nodes during reconstruction is expensive (e.g., time consuming), so that the encoding system 102 can read fewer chunks during reconstruction than would be required using conventional coding techniques. Small numbers of damaged chunks can be reconstructed by reading small numbers of other chunks (row code chunks and other data chunks in rows), and large numbers of damaged chunks can be reconstructed using the word code chunks when needed.

The codes are useful, for example, where a correlation of storage node failures within each group of storage nodes is higher than a correlation of failures between groups of storage nodes, or where communication between storage nodes at a group uses fewer resources or has a lower latency than communication between groups of storage nodes, or where reducing the number of chunks required to be read in order to reconstruct a small number of damaged chunks is advantageous.

In some implementations, metadata is used at the encoding system 102 or the data centers 104, 106, and 108 or both to keep track of data. For example, the metadata can specify which parts of a file are stored at which data centers, where redundant copies of data are stored, which data chunks and code chunks form codewords, and the like.

Figure 2A:
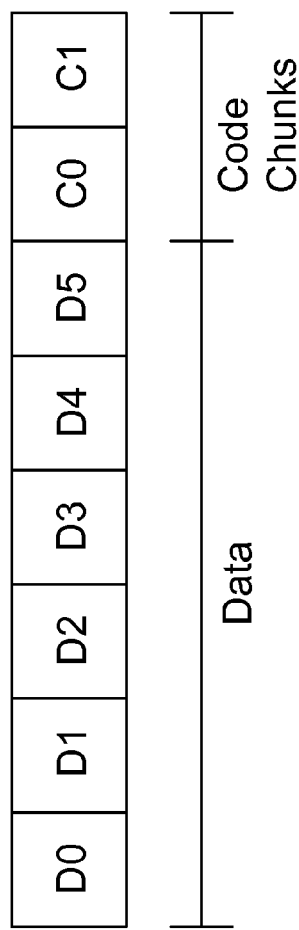
Figure 2B:
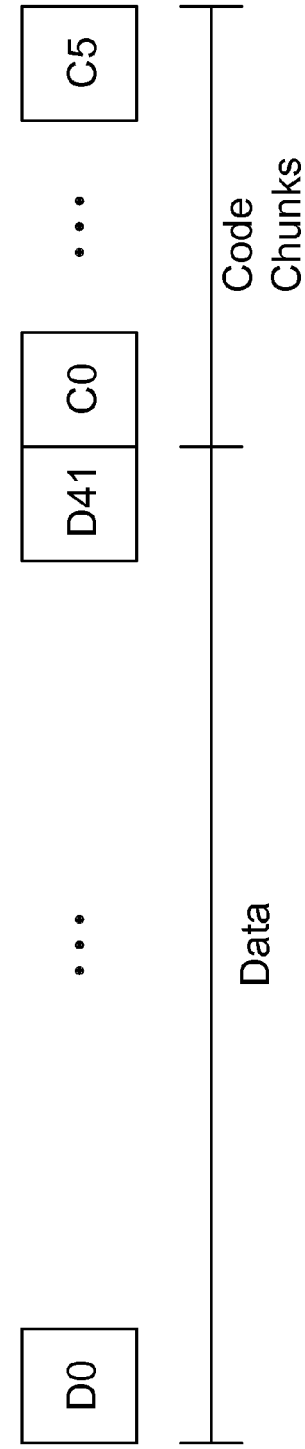

FIGS. 2A-C are schematic diagrams that illustrate an example layered coding technique by showing data chunks and code chunks that form codewords.

An error-correcting code is in systematic form if resulting codewords can be partitioned into two sets of chunks, one set including the data chunks and one set including the code chunks. A code in systematic form is Maximal Distance Separable (MDS) if it has N code chunks and it can correct any N damaged chunks. A layered code is created from two MDS codes, e.g., Reed-Solomon codes or parity codes, in systematic form. One code is used to create the row code chunks and the other code is used to create the word code chunks.

Consider the example illustrated in FIGS. 2A-C, where a block of 42 data chunks labeled D0-D41 are encoded with a layered code. In FIG. 2A, a first row of data chunks is shown, D0-D5. Two row code chunks are shown for the row, C0 and C1. C0 and C1 are based on D0-D5. Thus, D0-D5 and C0-C1 form a codeword. In FIG. 2B, the whole block of data chunks D0-D41 is illustrated, and six code chunks C0-C5 are illustrated. C0-C5 are based on D0-D41. Thus, D0-41 and C0-C5 form a codeword.

FIG. 2C illustrates a resulting encoded block that includes the block of data chunks and additional code chunks (row code chunks and word code chunks). The i-th row code chunk in row j is denoted Ci,j. So C0,0 and C1,0 are both row code chunks for D0-D5. Together, D0-D5 and C0,0 and C1,0 form a codeword. The word code chunks C0-C5 are shown in the last row. Together, D0-D41 and C0-C5 form a codeword. C0,7 and C1,7 can be generated based on C0-C5, so that C0,7 and C1,7 and C0-C5 form a codeword.

In the example shown in FIG. 2C, the word code chunks fill a whole row. However, layered codes can be created with an arbitrary number of full rows of word code chunks plus an optional partial row of word code chunks. If the data chunks and the word code chunks do not fill an integral number of rows, empty zero-valued chunks can be added to the 2D array. Those chunks do not have to actually be stored and they would never be in error.

In general, a layered code with X row code chunks per row and N word code chunks can reconstruct up to X damaged chunks per row while performing only intra-row communication. If after reconstructing those damaged chunks, N or fewer damaged chunks remain in the 2D array (within the data plus word code chunks portion of the 2D array), the damaged chunks can be reconstructed using the word code chunks and the row code chunks. This is true because N or fewer damaged chunks in the data chunks plus the word code chunks can be reconstructed using only the word code chunks. Then, if any row code chunks are damaged, they can be reconstructed from the data chunks of their rows.

Figure 3:
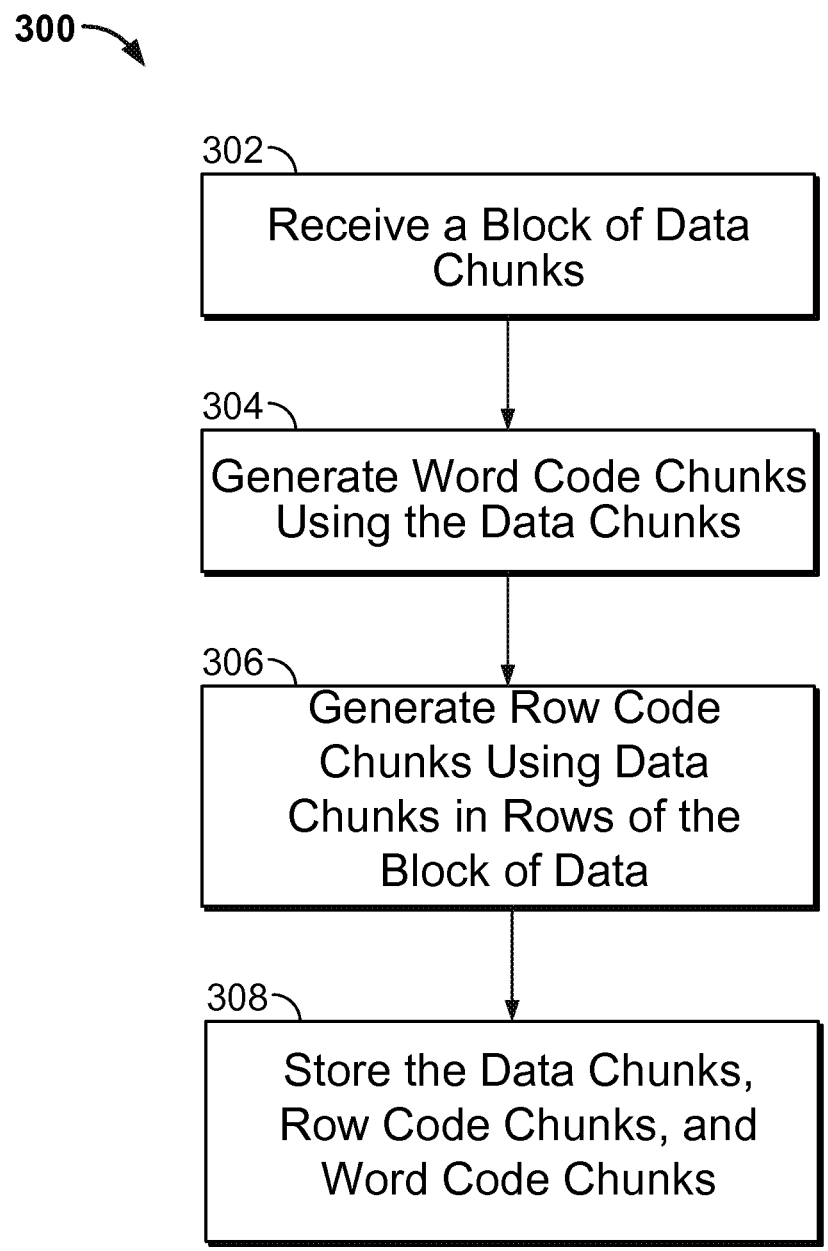
FIG. 3 is a flow diagram of an example process 300 for storing data using a layered code.

FIG. 3 is a flow diagram of an example process 300 for storing data using a layered code. The process 300 can be performed by, for example, a system of one or more data processing apparatus (e.g., the encoding system 102 of FIG. 1). For purposes of illustration, the process 300 will be described with respect to a system that performs the process 300.

The system receives a block of data chunks (step 302). For example, the data chunks can be from a file that is being stored. The block of data chunks can include m*n data chunks, where m and n are greater than one.

The system generates one or more rows of word code chunks using a first error-correcting code in systematic form and the data chunks (step 304). The rows of word code chunks can have different numbers of word code chunks in the rows. The data chunks and the word code chunks, taken together, form a codeword.

For each row of one or more rows of the data chunks, the system generates one or more row code chunks for the row using a second error-correcting code in systematic form and the data chunks of the row (step 306). The first and second error-correcting codes can be distinct. The rows can have different numbers of row code chunks. The system can also generate row code chunks for the rows of word code chunks.

The system stores the data chunks, row code chunks, and word code chunks (step 308). In some implementations, the system allocates each row and the row's row code chunks to a distinct group of storage nodes. In some other implementations, the system stores the data chunks and the code chunks at a same group of storage nodes, e.g., a single data center.

When the system allocates a row of chunks to a group of storage nodes, the row code chunks can be generated at different locations. For example, the row code chunks can be generated by a central encoding system (e.g., the encoding system 102 of FIG. 1) that performs the allocation or by the group of storage nodes after receiving a row of data chunks. At each group of storage nodes, each of the allocated data chunks, row code chunks, and word code chunks can be stored at a distinct storage node.

When the system identifies a damaged data chunk at a first group of storage nodes, the system attempts to reconstruct the damaged chunk without communication with other groups of storage nodes (using the row code chunks). In some cases, the system reconstructs as many other damaged data chunks at the first group of storage nodes as is possible using the row code chunks and any healthy data chunks allocated to the first group of storage nodes. If the system determines that the damaged chunk cannot be reconstructed without communicating with other groups of storage nodes, the system identifies (e.g., by requesting and receiving) healthy chunks from other groups of storage nodes so that at least m*n healthy chunks are available, where the healthy chunks are data chunks, word code chunks, or both, and reconstructs the damaged data chunk using the healthy chunks. In some cases, the system instructs the other groups to reconstruct as many other damaged chunks of data at those groups as is possible using each group's row code chunks and any healthy data chunks allocated to those groups.

Figure 4A:
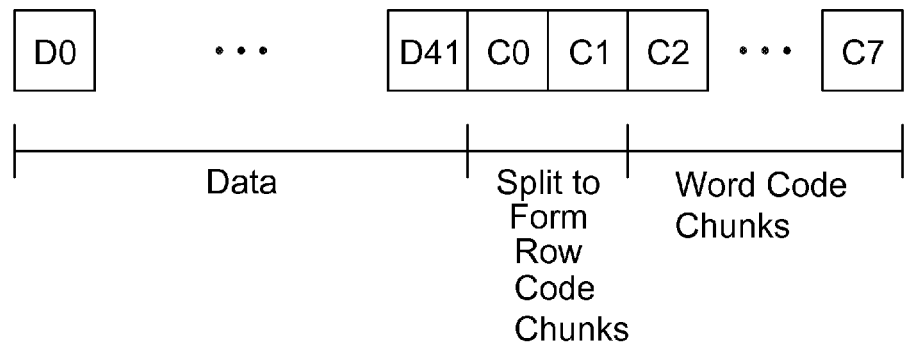
Figure 4B:
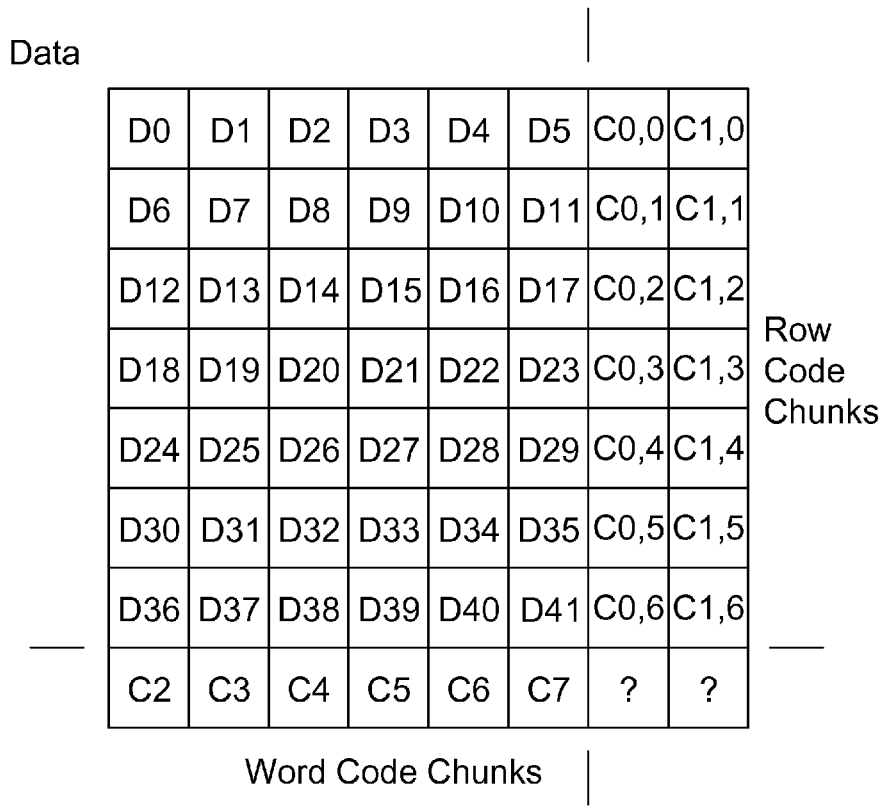

FIGS. 4A-C are schematic diagrams that illustrate an example nested coding technique by showing data chunks and code chunks that form codewords. The example nested coding technique is a two dimensional (2D) nested coding technique.

Nested coding techniques differ from layered coding techniques by creating a different relationship between the row code chunks and the word code chunks. A 2D nested code is created from an arbitrary linear MDS code in systematic form. Word code chunks that are based on a block of data chunks are partitioned into two groups, the first group including X code chunks and the second group including N code chunks. The block of data is viewed as forming an array of rows, and X code chunks in the first group are used to create X row chunks per row by "splitting" them into separate components per row ("split" row code chunks). The N code chunks in the second group form word code chunks.

For example, FIG. 4A shows a block of data chunks D0-D41 and code chunks C0-C7 that are based on the block of data chunks D0-D41. The data chunks D0-D41 and the code chunks C0-C7 form a codeword. The code chunks are partitioned into a first group that includes C0-C1 and a second group that includes C2-C7. C0-C1 are split to form split row code chunks. C2-C7 are used as word code chunks.

FIG. 4B illustrates a resulting encoded block that includes the block of data chunks and additional code chunks (split row code chunks and word code chunks). To generate a split row code chunk corresponding to C0 for row j (denoted C0,j), C0 is generated as though all the data chunks not in row j have the value zero. That is, C0,j has the value that would result from performing the operations to generate C0 using the full block of data chunks but instead using only the row j, with all of the other rows zeroed out. For example, if a generator matrix would be used to generate C0 for the full block of data chunks, then the generator matrix can be modified to generate C0,j so that it has the value that would result from using the original generator matrix and applying that original generator matrix to the block of data chunks with data chunks in rows other than row j zeroed out. An example of modifying a generator matrix in this manner is given in FIGS. 5A-C.

The split row chunks for C1,j for each row are generated similarly, but using C1 instead of C0. As a result, C0 is a linear combination of C0,0-C0,6 and C1 is a linear combination of C1,0-C1,6. That is, $C0=\Sigma_{j=0}^{6}C0,j$ and $C1=\Sigma_{j=0}^{6}C1,j$. The chunks denoted as "?" in FIG. 4B can be generated in various ways, e.g., as described further below with reference to FIG. 4C.

In the example of FIGS. 4A and 4B, the resulting encoded block of data includes 42 data chunks and 8 code chunks. Referring to the original code used to create the encoded block, the code chunks belong to one of two groups as described above, X=2 of which are in the first group and N=6 of which are in the second group. Whenever there are two or fewer (X or fewer) damaged chunks within one of the first seven rows, the damaged chunks can be corrected using the healthy chunks of the row and the split row code chunks for the row. To see this, let j denote the row including the two or fewer damaged chunks and consider the codeword obtained by zeroing-out all the data chunks from rows other than j. In that codeword, C0=C0,j and C1=C1,j. As a result, the two or fewer damaged chunks in row j can be reconstructed within row j by using the split row code chunks, by viewing the other rows as containing all-zero data chunks, and by viewing the word code chunks as being damaged.

In the example shown in FIG. 4B, the word code chunks fully fill an entire row (the bottom row). 2D nested codes can be created with an arbitrary number of rows of word code chunks. The rows of word code chunks can have the same number of columns as the rows of data chunks or different numbers of columns, and the rows of word code chunks can have different numbers of columns from each other. Rows of word code chunks can, but do not have to, have row code chunks. Increasing the number of word code chunks improves the reliability of the stored data but uses more storage at storage nodes. In general, for nested codes, rows include either data chunks or word code chunks and not both.

In general, a 2D nested code with X split row code chunks per row and N word code chunks can be used to reconstructed X damaged chunks per row (in those rows that include data chunks) while performing only intra-row communication (which is typically, e.g., intra-data center communication). In reconstructing multiple damaged chunks within the block, those damaged chunks are typically reconstructed first because intra-row communication is less expensive than inter-row communication, but other damaged chunks may remain. If, after reconstructing damaged chunks within rows, (N+X) or fewer other chunks are still damaged (because they were not able to be reconstructed using intra-row communication), those other damaged chunks can be reconstructed using the word code chunks and the split row code chunks. The word code chunks in the first group (C0 and C1 in FIG. 4B) can be determined from the split row code chunks, e.g., using the formula $Ci=\Sigma_{j=0}^{6}Ci,j$, even though those word code chunks are not explicitly stored.

To see this, let Z denote the number of word code chunks that are damaged and let Y denote the number of word code chunks in the first group that cannot be reconstructed from their corresponding split row code chunks according to the formula $Ci=\Sigma_{j=0}^{6}Ci,j$ due to split row code chunks being damaged. Using that formula, X−Y word code chunks from the first group can be determined, resulting in a codeword (e.g., the one shown in FIG. 4A) with Y damaged word code chunks in the first group and Z damaged word code chunks in the second group. Because there are at most N+X total damaged chunks, there are at most N+X−Y−Z damaged data chunks. Thus, it is possible to use the resulting codeword to reconstruct all of the damaged chunks, as it includes at most N+X−Y−Z+Y+Z=N+X damaged chunks.

FIG. 4C illustrates a resulting encoded block that includes row code chunks for the word code chunks. Compared to the encoded block of FIG. 4B, the block of FIG. 4C includes the row code chunks C0,7 and C1,7 in place of the locations marked "?" in FIG. 4B. This is one way to provide for reconstructing damaged word code chunks without relying on inter-row communication. The row code chunks C0,7 and C1,7 can be generated in various ways. For example, those row code chunks can be generated based on C2-C7 in the same manner that C0,0 and C1,0 are generated based on D0-D5. The resulting encoded block of FIG. 4C (using the example nested code) can be used to reconstruct up to eight damaged chunks after performing intra-row reconstruction, whereas the resulting encoded block of FIG. 2C (using the example layered code) can be used to reconstruct up to six damaged chunks after performing intra-row reconstruction. Row code chunks can be added for any number of rows that include word code chunks.

Figures 5A, 5B:
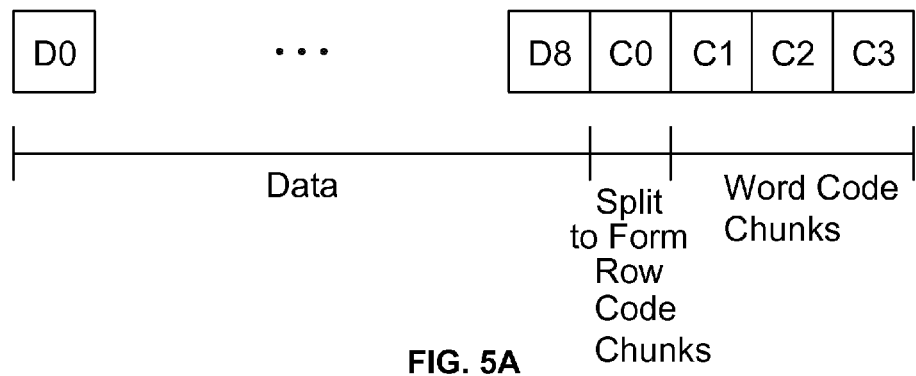

FIGS. 5A-C illustrate an example nested code by showing an example generator matrix for the code. The example nested code is created from a systematic MDS code with nine data chunks D0-D8 and four word code chunks C0-C3. FIG. 5A illustrates the resulting codeword, and shows that word code chunk C0 is to be split across rows to form split row code chunks and C1-C3 will be used as word code chunks in the layered coding techniques described above.

Suppose that the data chunks to be encoded are viewed as a row vector of length nine and that, in order to encode the data with the systematic MDS code, the row vector is right-multiplied by a 9×13 generator matrix G. Further suppose that the first code chunk C0 is the parity of the data chunks. FIG. 5B shows the resulting generator matrix G. To create split row code chunks using code chunk C0, the generator matrix is modified to create a splitting generator matrix that codes the same as G applied to the data chunks with the data chunks zeroed-out for rows other than a given row. FIG. 5C shows a 9×15 splitting generator matrix to split the code chunk C0.

Figure 6A:
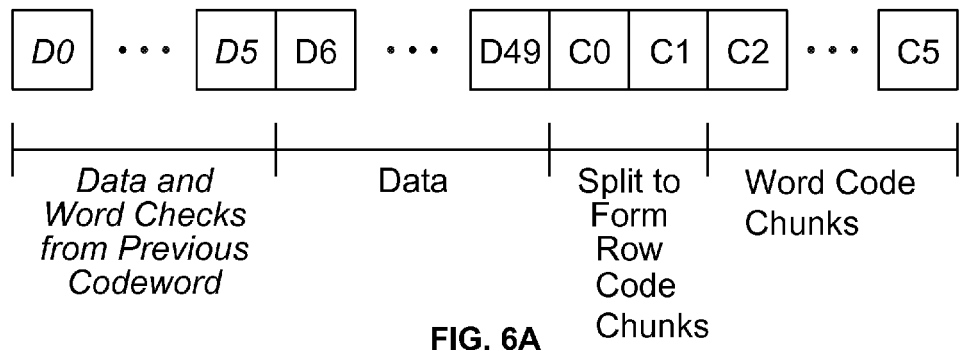
FIGS. 6A-C are schematic diagrams that illustrate an example three dimensional (3D) nested coding technique by showing data chunks and code chunks that form codewords.
Figure 6B:
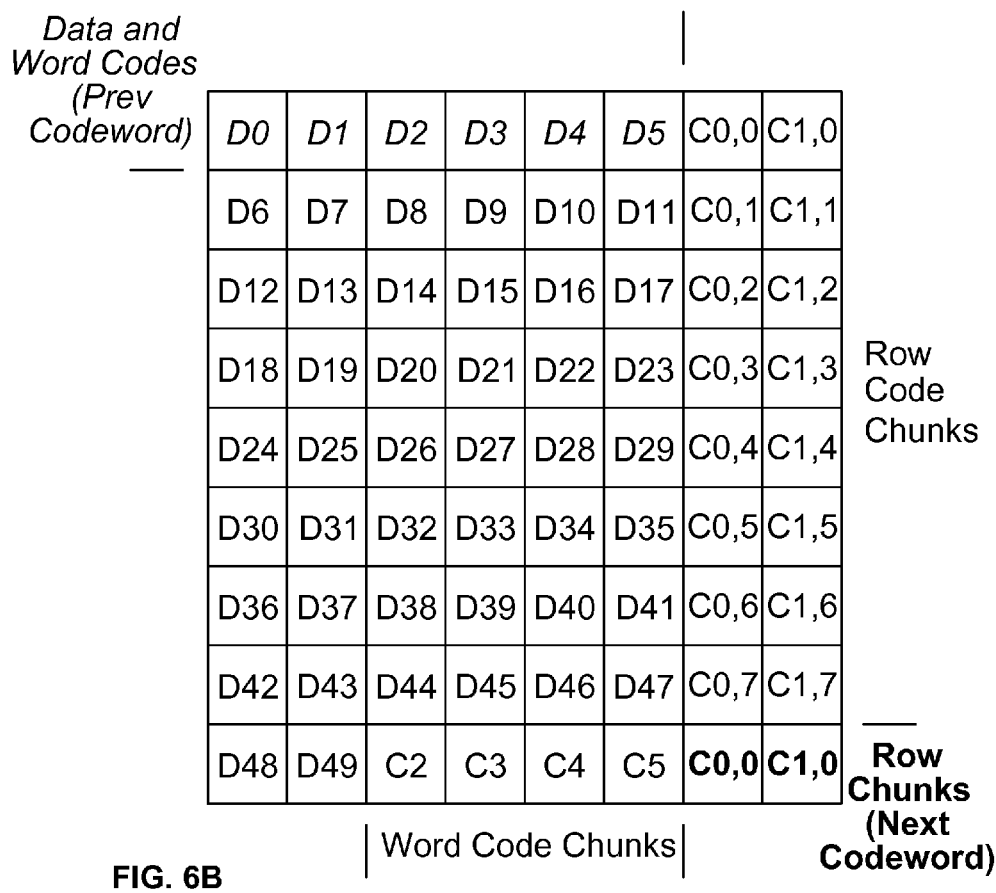
Figure 6C:
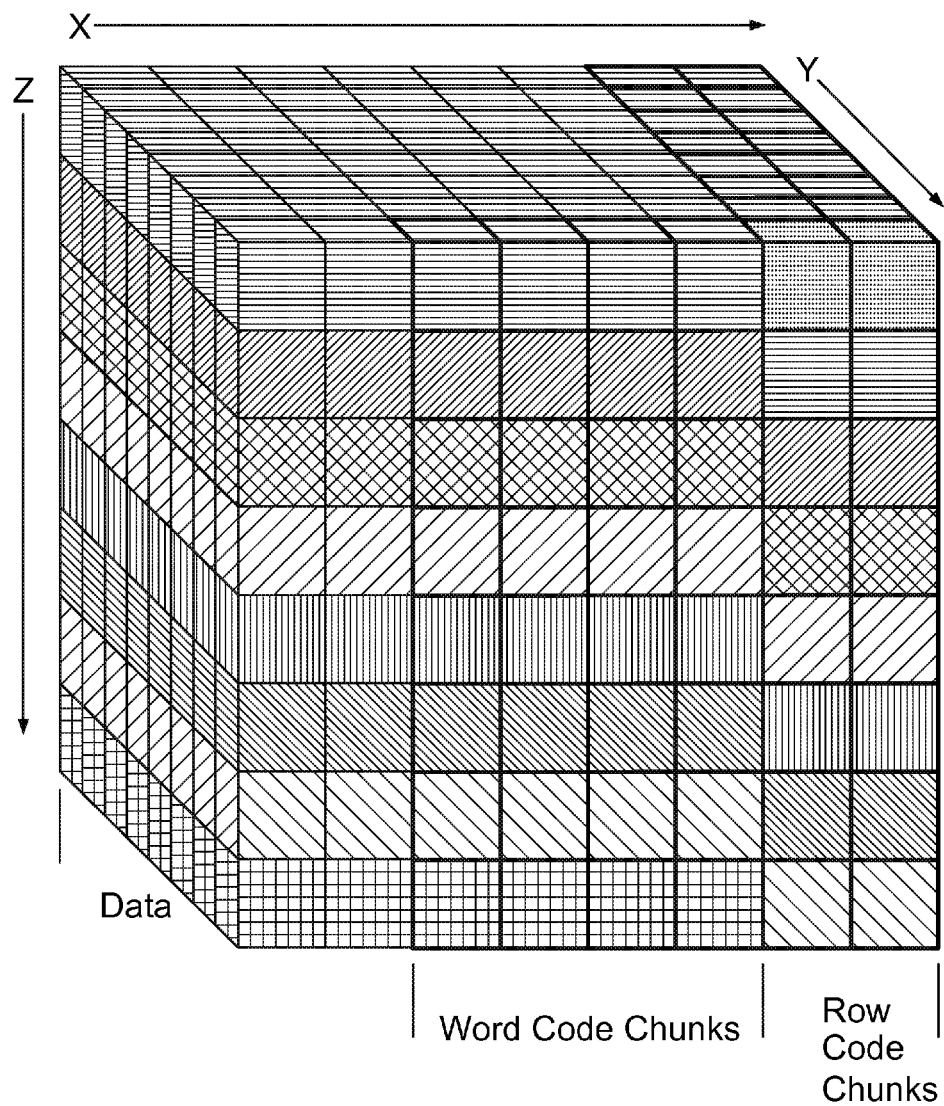

FIGS. 6A-C are schematic diagrams that illustrate an example three dimensional (3D) nested coding technique by showing data chunks and code chunks that form codewords.

2D nested codes, e.g., as described above with reference to FIGS. 4A-C, can have an integral number of rows of word code chunks that are fully filled (although, as noted above, rows of word code chunks can have different lengths.) It is possible to add a third dimension to an encoded block of data to allow for rows of word code chunks that are not fully filled. Consider a codeword with a row of word code chunks that is not fully filled with word code chunks because some data chunks are also in the row. The row can be viewed as playing the role of data within a next codeword. In this manner, the row that is viewed as including data chunks and word code chunk from a codeword i is viewed as a data row for codeword i+1, so that damaged chunks within that row are reconstructed using codeword i+1.

FIG. 6A shows an example codeword for a 3D nested coding technique. The codeword includes 44 data chunks from the current codeword, plus two data chunks and four word code chunks from the previous codeword. The data chunks and word chunks from the previous codeword are shown in italics and labeled D0-D5.

FIG. 6B shows a 2D view of the resulting 3D codeword. D0-D5 are again shown in italics. D0-D1 corresponds to D48-D49 in the previous codeword and D2-D5 correspond to C2-C5 in the previous codeword. Row code chunks C0,0 and C1,0 belong to the next codeword and are shown in bold.

FIG. 6C shows a 3D view of a group of codewords stored using a 3D nested code. The codewords form a 3D array, with each level corresponding to a codeword as shown in FIG. 6B, and with successive codewords being placed on successively higher levels.

In FIG. 6B, there are eight rows per level, whereas in FIG. 6C nine rows per level are illustrated. This is because the first and last rows in FIG. 6B both correspond to a row on the front face of the 3D array of FIG. 6C. The top row of FIG. 6B corresponds to the row in the face of FIG. 6C immediately below the row that corresponds to the bottom row in FIG. 6B.

The 3D array maps to storage nodes within data centers (or other groups of storage nodes) by having data chunks with fixed X and Y coordinates map to a single node, and by having chunks in a same row (having the same Y coordinate) be within a given data center. The level immediately below the bottom level in the 3D array can be viewed as containing all zero data, including all-zero row code chunks and word cord chunks. The all-zero data does not have to be stored and does not ever have to be considered damaged. The top level can be viewed as containing all-zero data chunks (that do not have to be stored or ever considered damaged), but potentially non-zero word code chunks, and thus potentially having non-zero row code chunks in the rows including word code chunks. Because the data in the top has a fixed value (all-zero), the techniques described for 2D nested codes can be used to reconstruct damaged chunks in the top level.

By having the word code chunks of one codeword provide for reconstruction in the row including both data chunks and word code chunks of the previous codeword, damaged chunks can be reconstructed in various ways. In particular, the split row code chunks can be used to reconstruct X or fewer damaged chunks per row. Then, after reconstructing those damaged chunks, if each level of the 3D array has at most N+X damaged chunks, all of the damaged chunks can be reconstructed.

To see this, start with the bottom-most codeword, which includes all of the bottom-most level except the split row code chunks from the next codeword. N+X or fewer damaged chunks can be reconstructed in this codeword by using the technique described above in reference to 2D nested codes. Then, by iterating that technique and moving upwards through the 3D array, damaged chunks in the different codewords can be reconstructed. By iterating upwards in this manner, when damaged chunks in a codeword i are reconstructed, the damaged chunks in codeword i−1 have already been reconstructed, so the remaining damaged chunks are in level i of the 3D array. In general, it is possible to reconstruct damaged chunks from separate codewords independently and in any order; however, that approach provides for reconstruction of N+X damaged chunks per codeword rather than N+X damaged chunks per level.

Figure 7:
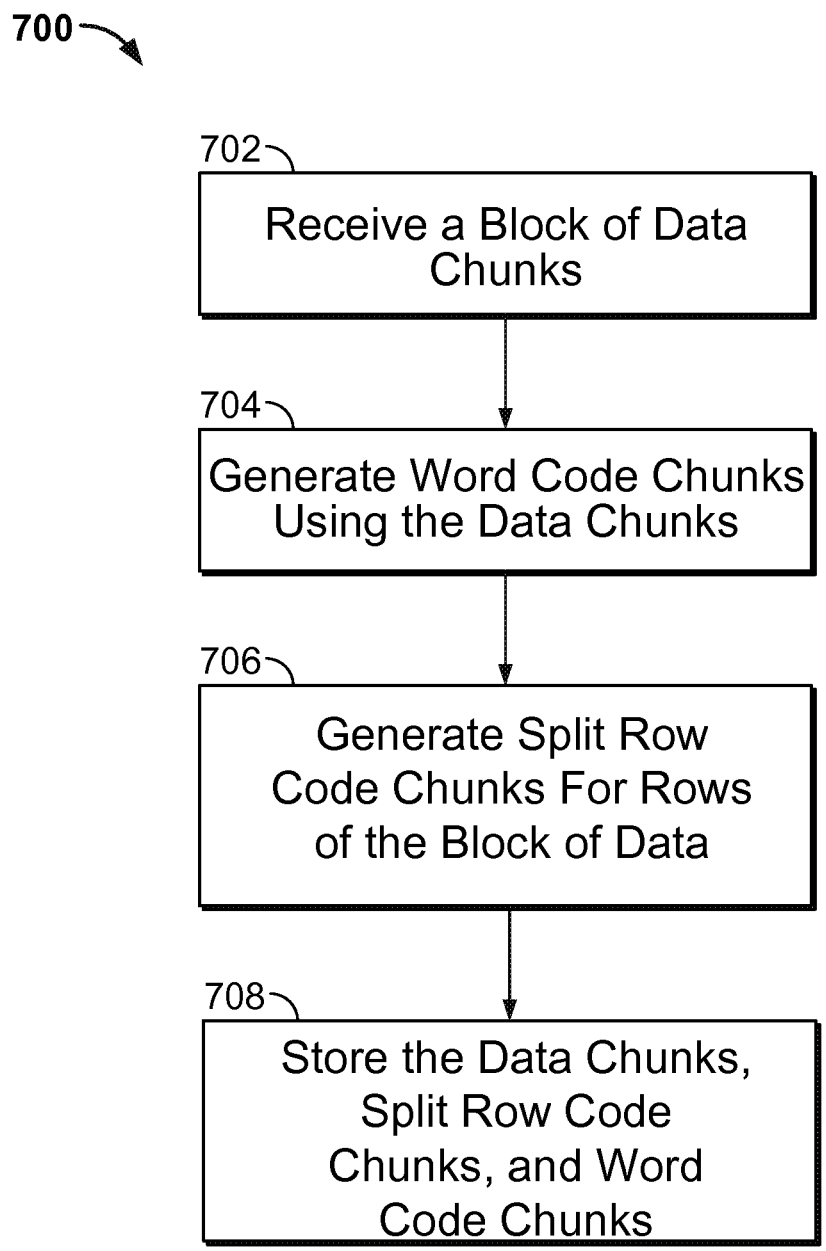
FIG. 7 is a flow diagram of an example process 700 for storing data using a nested code.

FIG. 7 is a flow diagram of an example process 700 for storing data using a nested code. The process 700 can be performed by, for example, a system of one or more data processing apparatus (e.g., the encoding system 102 of FIG. 1). For purposes of illustration, the process 700 will be described with respect to a system that performs the process 700.

The system receives a block of data (step 702). The block of data can include m*n data chunks, wherein m and n are greater than one.

The system generates one or more rows of word code chunks using a first linear error-correcting code in systematic form and the data chunks (step 704). The word code chunks and the data chunks form a codeword.

For each of m rows of data chunks, the system generates one or more split row code chunks for the row (step 706). The split row code chunks are generated so that a linear combination of m split row code chunks from different rows forms a first word code chunk of a first codeword including the data chunks and the n word code chunks. The first word code chunk (and any other word code chunks resulting from a linear combination of split row code chunks from different rows) forms a codeword with the data chunks and the word code chunks generated in step 704. For example, the split row code chunks for each row can be generated using a splitting error-correcting code and the n data chunks or the word code chunks, wherein the splitting error-correcting code comprises a splitting generator matrix that codes the same as a generator matrix for the first linear error-correcting code applied to the data chunks with the data chunks zeroed-out for rows other than the row.

The system stores the rows of data chunks and the split row code chunks and the word code chunks (step 708). In some implementations, the system stores all the chunks at a single group of storage nodes. In some other implementations, the system allocates each row to a distinct group of storage nodes.

When the system identifies one or more damaged chunks, the system can reconstruct the damaged chunks using the split row code chunks and the word code chunks. Typically, the system attempts to reconstruct damaged chunks using the split row code chunks. If, after reconstructing damaged chunks using only the split row code chunks, some damaged chunks remain, the system uses the word code chunks for reconstruction, including the word code chunks that can be determined by determining a linear combination of the split row code chunks.

Figure 8:
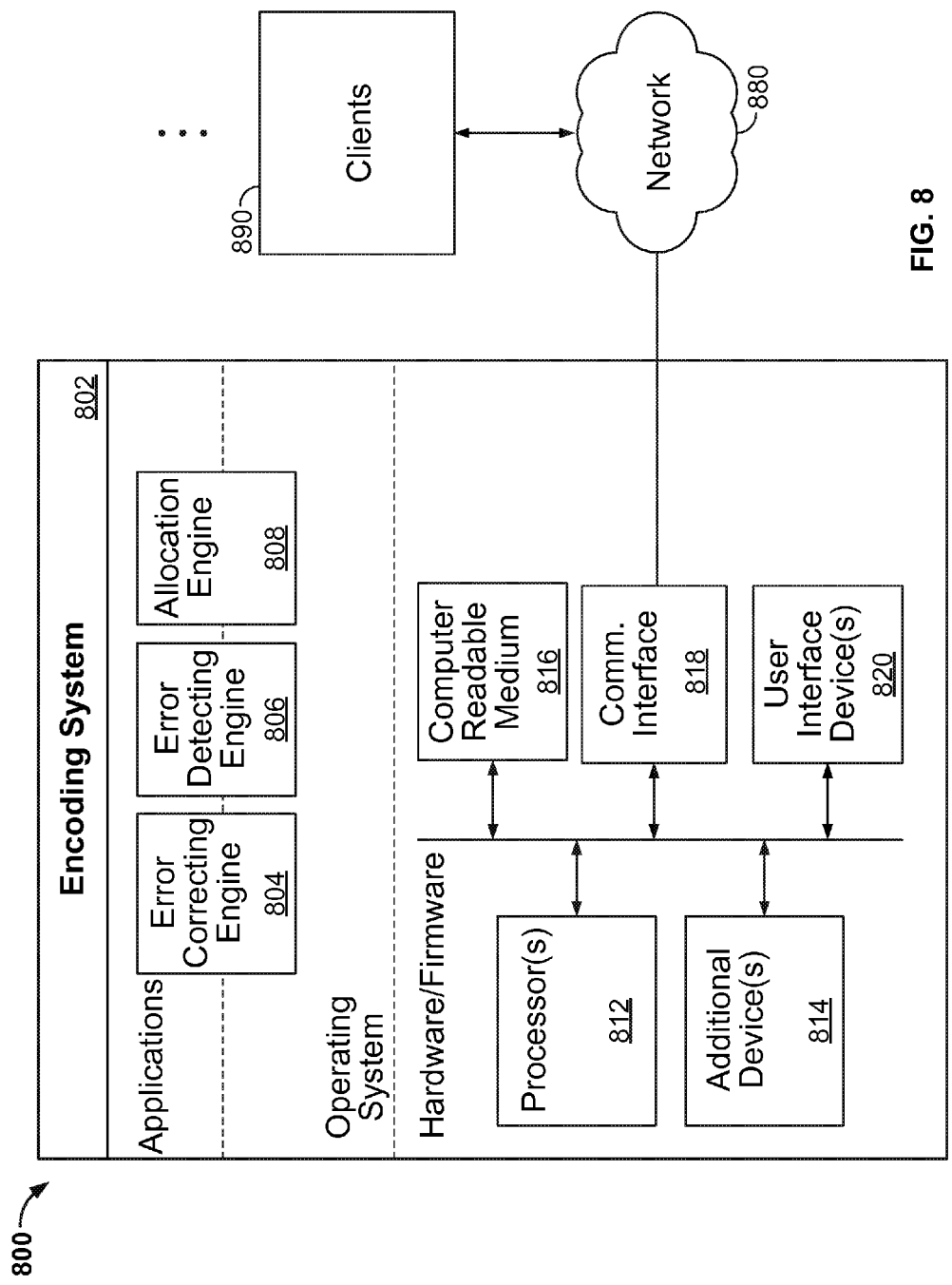
FIG. 8 is a schematic diagram of an example system configured for data storage, access, and maintenance.

FIG. 8 is a schematic diagram of an example system configured for data storage, access, and maintenance. The system generally consists of an encoding system 802 of one or more computers. The system 802 is optionally connected to one or more user or client computers 890 through a network 880. The system 802 includes various modules, e.g. executable software programs, including an error correcting engine 804 for generating code chunks and reconstructing damaged chunks. An error detecting code engine 806 is configured to identify damaged chunks of data. An allocation engine 808 allocates code chunks and data chunks between one or more groups of storage nodes.

Each module runs as part of the operating system on the system 802, runs as an application on the system 802, or runs as part of the operating system and part of an application on the system 802, for instance. Although several software modules are illustrated, there may be fewer or more software modules. Moreover, the software modules can be distributed on one or more data processing apparatus connected by one or more networks or other suitable communication mediums.

The system 802 also includes hardware or firmware devices including one or more processors 812, one or more additional devices 814, a computer readable medium 816, a communication interface 818, and optionally one or more user interface devices 820. Each processor 812 is capable of processing instructions for execution within the system 802. In some implementations, the processor 812 is a single or multi-threaded processor. Each processor 812 is capable of processing instructions stored on the computer readable medium 816 or on a storage device such as one of the additional devices 814. The system 802 uses its communication interface 818 to communicate with one or more computers 890, for example, over a network 880.

In some implementations, the system 802 does not have any user interface devices. In other implementations, the system 802 includes one or more user interface devices. Examples of user interface devices 820 include a display, a camera, a speaker, a microphone, a tactile feedback device, a keyboard, and a mouse. The system 802 can store instructions that implement operations associated with the modules described above, for example, on the computer readable medium 816 or one or more additional devices 814, for example, one or more of a floppy disk device, a hard disk device, an optical disk device, or a tape device.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method performed by one or more computers, the method comprising:
   receiving a block of data comprising a plurality of data chunks, the plurality of data chunks comprising a plurality of rows of data chunks;
   generating one or more rows of word code chunks using a first error-correcting code in systematic form and the plurality of data chunks, wherein each of the word code chunks is generated based on the plurality of data chunks;
   for each row of the plurality of rows of data chunks, generating one or more row code chunks for the row using a second error-correcting code in systematic form and the data chunks of the row, wherein each of the row code chunks is generated based on the data chunks of the row; and
   storing the rows of data chunks and the row code chunks and the rows of word code chunks.

2. The method of claim 1, wherein storing the rows of data chunks and the row code chunks comprises allocating each row to a distinct group of storage nodes.

3. The method of claim 2, wherein a correlation of storage node failures within each group of storage nodes is higher than a correlation of failures between groups of storage nodes.

4. The method of claim 2, wherein communication between storage nodes at a group uses fewer resources or has a lower latency than communication between groups of storage nodes.

5. The method of claim 2, wherein each group of storage nodes is a data center.

6. The method of claim 2, further comprising:
   identifying a damaged data chunk at a first group of storage nodes;
   determining that the damaged data chunk cannot be reconstructed without communicating with other groups of storage nodes;
   receiving healthy chunks from other groups of storage nodes so that at least m*n healthy chunks are available, wherein the healthy chunks are data chunks, word code chunks, or both, wherein the block of data includes m*n chunks, and wherein m and n are integers greater than one; and
   reconstructing the damaged data chunk using the healthy chunks.

7. The method of claim 6, further comprising:
   reconstructing as many other damaged data chunks at the first group of storage nodes as is possible using the row code chunks and any healthy data chunks allocated to the first group of storage nodes.

8. The method of claim 6, wherein receiving healthy chunks comprises instructing the other groups to reconstruct as many other damaged chunks of data at those groups as is possible using each group's row code chunks and any healthy data chunks allocated to those groups.

9. The method of claim 6, wherein determining that the damaged data chunk cannot be reconstructed without communicating with other groups of storage nodes comprises determining that a number of damaged chunks of the m*n chunks at the first group of storage nodes is greater than the number of row code chunks allocated to the first group of storage nodes for the m*n chunks.

10. The method of claim 1, wherein the first error-correcting code is distinct from the second error-correcting code.

11. The method of claim 1, wherein the first error-correcting code and the second error-correcting code are maximum distance separable (MDS) codes.

12. The method of claim 1, wherein each data chunk and each code chunk is stored using an error-detecting code so that damaged chunks can be identified.

13. The method of claim 1, wherein storing the rows of data chunks and the row code chunks comprises storing each chunk at a distinct storage node.

14. A system comprising one or more computers configured to perform operations comprising:
   receiving a block of data comprising a plurality of data chunks, the plurality of data chunks comprising a plurality of rows of data chunks;
   generating one or more rows of word code chunks using a first error-correcting code in systematic form and the plurality of data chunks, wherein each of the word code chunks is generated based on the plurality of data chunks;
   for each row of the plurality of rows of data chunks, generating one or more row code chunks for the row using a second error-correcting code in systematic form and the data chunks of the row, wherein each of the row code chunks is generated based on the data chunks of the row; and
   storing the rows of data chunks and the row code chunks and the rows of word code chunks.

15. The system of claim 14, wherein storing the rows of data chunks and the row code chunks comprises allocating each row to a distinct group of storage nodes.

16. The system of claim 15, wherein a correlation of storage node failures within each group of storage nodes is higher than a correlation of failures between groups of storage nodes.

17. The system of claim 15, wherein communication between storage nodes at a group uses fewer resources or has a lower latency than communication between groups of storage nodes.

18. The system of claim 15, wherein each group of storage nodes is a data center.

19. The system of claim 15, the operations further comprising:
   identifying a damaged data chunk at a first group of storage nodes;
   determining that the damaged data chunk cannot be reconstructed without communicating with other groups of storage nodes;
   receiving healthy chunks from other groups of storage nodes so that at least m*n healthy chunks are available, wherein the healthy chunks are data chunks, word code chunks, or both, wherein the block of data includes m*n chunks, and wherein m and n are integers greater than one; and
   reconstructing the damaged data chunk using the healthy chunks.

20. The system of claim 19, the operations further comprising:
   reconstructing as many other damaged data chunks at the first group of storage nodes as is possible using the row code chunks and any healthy data chunks allocated to the first group of storage nodes.

21. The system of claim 19, wherein receiving healthy chunks comprises instructing the other groups to reconstruct as many other damaged chunks of data at those groups as is possible using each group's row code chunks and any healthy data chunks allocated to those groups.

22. The system of claim 19, wherein determining that the damaged data chunk cannot be reconstructed without communicating with other groups of storage nodes comprises determining that a number of damaged chunks of the m*n chunks at the first group of storage nodes is greater than the number of row code chunks allocated to the first group of storage nodes for the m*n chunks.

23. The system of claim 14, wherein the first error-correcting code is distinct from the second error-correcting code.

24. The system of claim 14, wherein the first error-correcting code and the second error-correcting code are maximum distance separable (MDS) codes.

25. The system of claim 14, wherein each data chunk and each code chunk is stored using an error-detecting code so that damaged chunks can be identified.

26. The system of claim 14, wherein storing the rows of data chunks and the row code chunks comprises storing each chunk at a distinct storage node.

27. A non-transitory computer storage medium encoded with a computer program, the program comprising instructions that when executed by one or more computers cause the computers to perform operations comprising:
   receiving a block of data comprising a plurality of data chunks, the plurality of data chunks comprising a plurality of rows of data chunks;
   generating one or more rows of word code chunks using a first error-correcting code in systematic form and the plurality of data chunks, wherein each of the word code chunks is generated based on the plurality of data chunks;
   for each row of the plurality of rows of data chunks, generating one or more row code chunks for the row using a second error-correcting code in systematic form and the data chunks of the row, wherein each of the row code chunks is generated based on the data chunks of the row; and
   storing the rows of data chunks and the row code chunks and the rows of word code chunks.

28. The computer storage medium of claim 27, wherein storing the rows of data chunks and the row code chunks comprises allocating each row to a distinct group of storage nodes.

29. The computer storage medium of claim 28, wherein a correlation of storage node failures within each group of storage nodes is higher than a correlation of failures between groups of storage nodes.

30. The computer storage medium of claim 28, wherein communication between storage nodes at a group uses fewer resources or has a lower latency than communication between groups of storage nodes.

31. The computer storage medium of claim 28, wherein each group of storage nodes is a data center.

32. The computer storage medium of claim 28, the operations further comprising:
   identifying a damaged data chunk at a first group of storage nodes;
   determining that the damaged data chunk cannot be reconstructed without communicating with other groups of storage nodes;
   receiving healthy chunks from other groups of storage nodes so that at least m*n healthy chunks are available, wherein the healthy chunks are data chunks, word code chunks, or both, wherein the block of data includes m*n chunks, and wherein m and n are integers greater than one; and reconstructing the damaged data chunk using the healthy chunks.

33. The computer storage medium of claim 32, the operations further comprising:

reconstructing as many other damaged data chunks at the first group of storage nodes as is possible using the row code chunks and any healthy data chunks allocated to the first group of storage nodes.

34. The computer storage medium of claim 32, wherein receiving healthy chunks comprises instructing the other groups to reconstruct as many other damaged chunks of data at those groups as is possible using each group's row code chunks and any healthy data chunks allocated to those groups.

35. The computer storage medium of claim 32, wherein determining that the damaged data chunk cannot be reconstructed without communicating with other groups of storage nodes comprises determining that a number of damaged chunks of the m*n chunks at the first group of storage nodes is greater than the number of row code chunks allocated to the first group of storage nodes for the m*n chunks.

36. The computer storage medium of claim 27, wherein the first error-correcting code is distinct from the second error-correcting code.

37. The computer storage medium of claim 27, wherein the first error-correcting code and the second error-correcting code are maximum distance separable (MDS) codes.

38. The computer storage medium of claim 27, wherein each data chunk and each code chunk is stored using an error-detecting code so that damaged chunks can be identified.

39. The computer storage medium of claim 27, wherein storing the rows of data chunks and the row code chunks comprises storing each chunk at a distinct storage node.

* * * * *